United States Patent
Ichikawa et al.

(10) Patent No.: US 6,550,953 B1
(45) Date of Patent: Apr. 22, 2003

(54) LIGHT EMITTING DIODE LAMP DEVICE

(75) Inventors: Tadaoki Ichikawa, Aichi-ken (JP);
Akihiro Misawa, Aichi-ken (JP);
Mitsuhiro Nawashiro, Aichi-ken (JP);
Toshinori Takahashi, Aichi-ken (JP);
Yoshiaki Ito, Aichi-ken (JP)

(73) Assignee: Toyoda Gosei Co. Ltd., Aichi-ken (JP)

( * ) Notice: Subject to any disclaimer, the term of this patent is extended or adjusted under 35 U.S.C. 154(b) by 187 days.

(21) Appl. No.: 09/640,913

(22) Filed: Aug. 18, 2000

(30) Foreign Application Priority Data

Aug. 20, 1999 (JP) ............................. 11-233384
Feb. 28, 2000 (JP) ........................ 2000-050989

(51) Int. Cl.[7] ................................................ B60Q 3/04
(52) U.S. Cl. ..................................................... 362/800
(58) Field of Search ............................... 315/56, 57, 58; 362/800; 257/79, 80, 81, 88, 89, 99

(56) References Cited

U.S. PATENT DOCUMENTS 5,093,768 A * 3/1992 Ohe ............................ 362/241
5,777,433 A * 7/1998 Lester et al. ................. 313/512
5,931,570 A * 8/1999 Yamuro ....................... 362/355
5,962,971 A * 10/1999 Chen .......................... 313/512
6,252,350 B1 * 6/2001 Alvarez ...................... 313/498
6,369,506 B1 * 4/2002 Hata .......................... 313/499
6,404,131 B1 * 6/2002 Kawano et al. ............... 315/82

FOREIGN PATENT DOCUMENTS

JP          9-162445          6/1997

* cited by examiner

*Primary Examiner*—Don Wong
*Assistant Examiner*—Minh D A
(74) *Attorney, Agent, or Firm*—McGinn & Gibb, PLLC

(57) ABSTRACT

A casing accommodates therein three primary colors of chip LEDs. The casing is disposed in a through hole of a plate-shaped light guide. The chip LEDs are mounted on both surfaces of a substrate so as to face a peripheral surface of the through hole (light incident surface). The casing is made of a transparent synthetic resin accommodating therein the substrate and the chip LEDs. The light emitted from the chip LEDs can be introduced directly into the light incident surface of the light guide. The three primary color of chip LEDs are controlled so that a desired color and intensity of light can be efficiently introduced into the light guide.

19 Claims, 14 Drawing Sheets

LIGHT EMITTING DIODE LAMP DEVICE

BACKGROUND OF THE INVENTION

1. Field of the Invention

This invention relates to a light emitting diode (LED) lamp device applicable to a light source of a light emitting body. Particularly, the invention is preferably used as a light source of a planar light emitting body such as a base structure (e.g. dial) of a vehicle meter and a display panel.

2. Description of the Related Art

Generally, a lamp bulb is used to illuminate a vehicle meter and the like. Japanese Laid Open Patent Publication No. 10-197671 shows a meter illumination that uses a multi-color LED (RGB-LED).

In that invention, a light guide is disposed on a meter and an RGB-LED is disposed on an end surface of the light guide. The LED emits light into the light guide and the light is sent out through a flat surface of the light guide so as to irradiate the entirety of the vehicle meter. The LED is mounted on a flexible printed circuit board (PCB) that is dedicated to the LED. A control circuit is packaged on the flexible PCB and controls the LED to illuminate the meter with a desired color of light.

The LED lamp used in that invention is a dome-shaped type and has a major light-emitting surface along a lens surface. Specifically, the major light emitting surface is formed on a semi-spherical part about a vertex of the LED lamp. Therefore, though the light goes into the end surface of the light guide from the LED, the light is not efficiently introduced into the light guide.

On the other hand, the dedicated LED can be disposed in a special application such as the technique disclosed in the above publication. However, the LED mounted on the dedicated flexible PCB cannot be used for a general purpose. Moreover, it is difficult to substitute the LED for the conventional bulb lamp, since the bulb and the LED have different standardized sizes.

BRIEF SUMMARY OF THE INVENTION

An object of the present invention is to provide an LED lamp device that is able to send light into a planar light guide at high efficiency when it is used as a light source for a planar light emitting body using the light guide.

Another object of the present invention is to provide an LED lamp device that can be used as a light source of a light emitting body in place of a bulb lamp regardless of the size difference between the bulb and the LED. This object aims at a general purpose application of the LED lamp device.

According to the first object of the invention, it relates to an LED lamp device that has a chip LED mounted on one or more surface of a substrate. It also includes a casing made of a transparent synthetic resin, the casing accommodating the chip LED and the substrate therein.

According to the first object of the invention, there is another LED lamp device that has a light guide of essentially planar shape. A chip LED is disposed on a plane perpendicular to the plane of the light guide, the chip LED emitting light directly onto an end surface of the light guide. A substrate has one or more surfaces on which the chip LED is mounted. A casing is made of a transparent synthetic resin, the casing accommodating the chip LED and the substrate therein. According to the second object of the invention, there is an LED lamp device that has an LED lamp. A power converting circuit converts an input power source voltage and an input power source current into a voltage and a current for driving the LED lamp. A synthetic resin housing accommodates therein the LED lamp and the power converting circuit. The housing fixes the LED lamp at one end thereof. The housing has a locking structure on an outer peripheral surface. The locking structure is mountable on an attachment hole of a base structure.

Further objects and advantages of the invention will be apparent from the following description and the reference to the accompanying drawings, wherein preferred embodiments of the invention are clearly shown.

DETAILED DESCRIPTION OF THE INVENTION

Several embodiments of the invention are described hereunder referring to the attached drawings. The same reference symbols are used to refer to the same elements throughout the description of the embodiments.

[First Embodiment]

Figure 1:
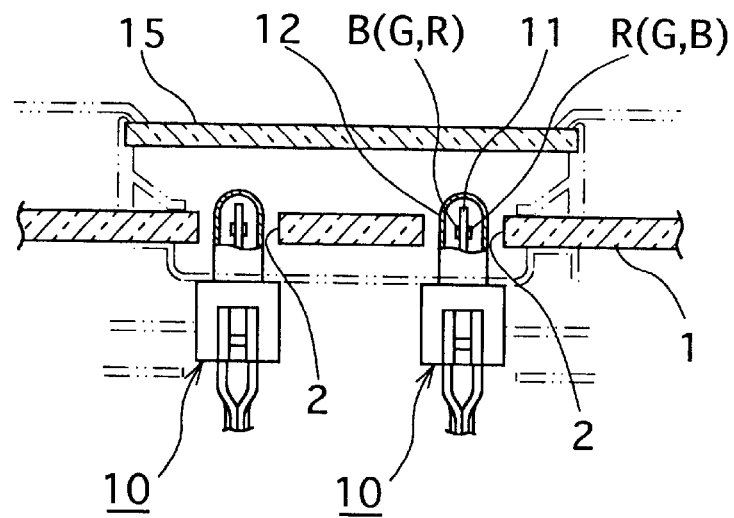
FIG. 1 is an explanatory drawing showing an arrangement of an LED lamp device according to the first embodiment of the invention.

FIG. 1 illustrates an arrangement of an LED lamp device according to the first embodiment of the invention.

Referring to FIG. 1, a light guide 1, which is essentially a planar shape, is made of a synthetic resin. The light guide 1 may consist of a plurality of planars. For example, an addition such as a dispersing agent may be combined as a part of the light guide. The light guide 1 has two through holes 2 formed at predetermined positions to conduct emitted light to the entire area of the light guide 1.

Two LED lamps 10 are disposed in the through holes 2, respectively. The LED lamp 10 has a substrate 11 and a pair of LED arrays mounted respectively on the front and the rear surfaces of the substrate 11. The LED array is composed of three primary colors of Chip LEDs: red Chip LED R, green Chip LED G and blue Chip LED B. The light emission surfaces of the Chip LEDs R, G, B are placed on a plane that is perpendicular to the plane of the light guide 1. Specifically, the light emission surfaces are placed parallel to a vertically extending end surface of the light guide 1. In this case, the vertically extending end surface of the through hole 2 of the light guide 1 defines a light incident surface from which the light of the Chip LEDs comes in.

Figure 2:
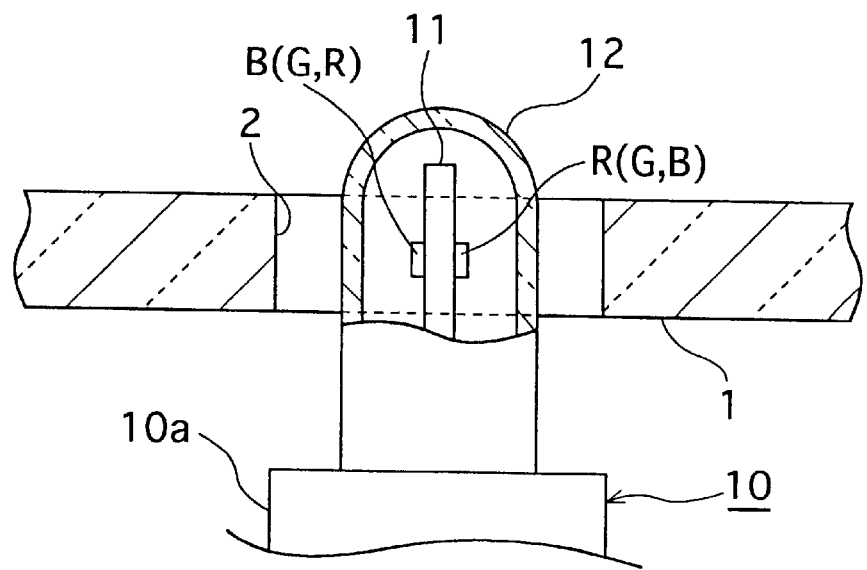
FIG. 2 is a partial sectional view of the first embodiment of the LED lamp device seen from a lateral side of the LED substrate of the LED lamp.

In detail, as shown in FIG. 2, the LED lamp 10 has a base 10a. The substrate 11 is made of a lead frame of a rectangular flat plate shape. The substrate 11 is fixed and erected on an upper surface of the base 10a at right angles.

Figure 3:
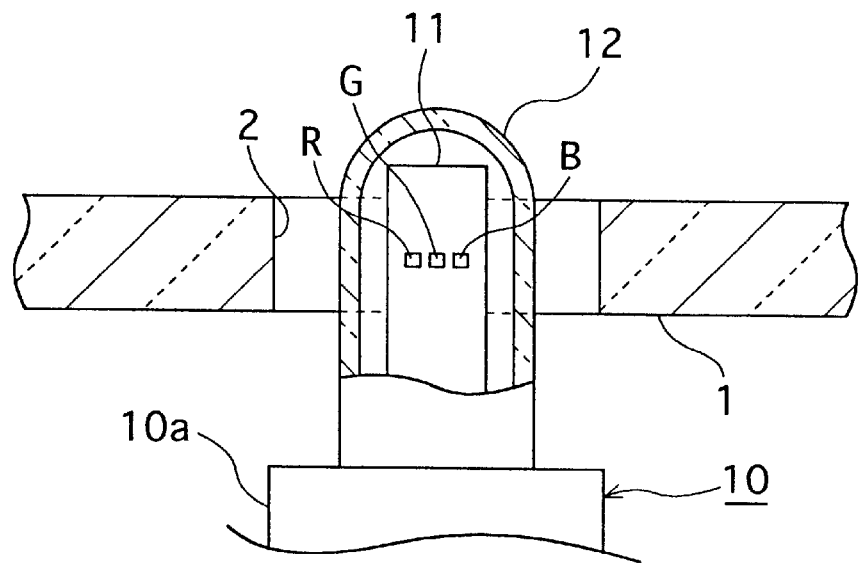
FIG. 3 is a partial sectional view of the first embodiment of LED lamp device seen from the front of the LED substrate.

Specifically, the substrate 11 is disposed on a plane perpendicular to the paper sheet plane of FIG. 1. As shown in FIG. 3, the chip LEDs R, G, B are arranged in a line on the front and the rear surfaces of the substrate 11, i.e. along the width of the lead frame. The three primary colors of the chip LEDs R, G, B may be disposed in the same order on the front and the rear surfaces of the substrate 11. Alternatively, they may be disposed in a different order (e.g. reverse order). Moreover, the chip LEDs R, G, B may be provided on only one of the front and rear surfaces of the substrate 11.

The "chip LED" itself is well known and has a substrate and an LED chip (LED element) mounted on the substrate in itself. Then, the chip LED functions as an LED lamp by itself.

A cap 12 is secured on the base 10a while accommodating therein the chip LEDs R, G, B and substrate 11 together. The cap 12 is made of a transparent synthetic resin such as an acrylic resin, an epoxy resin or the like and it has a hollow dome shape. The cap 12 constitutes a casing for accommodating and protecting the substrate 11 and the chip LEDs R, G, B. The cap 12, the substrate 11 and the chip LEDs R, G, B housed in the cap 12 constitute a dome-shaped package.

While the casing is composed of only the transparent cap 12 in the embodiment, the interior space of the cap 12 may be filled with a transparent synthetic resin such as an acrylic resin and an epoxy resin. Alternatively, the casing can also be made of only the synthetic resin without the cap 12. Moreover, the cap 12 and the filled synthetic resin may be formed of certain material to prevent reflection in consideration of a refractive index.

In the first embodiment, one set of the three different color (primary color) chip LEDs R, G, B is arranged in a row on each of the opposite surfaces of the substrate 11. However, the invention may have two or more sets of primary color chip LEDs R, G, B arranged in two or more rows on the front and/or the rear surface of the substrate 11.

Figure 4:
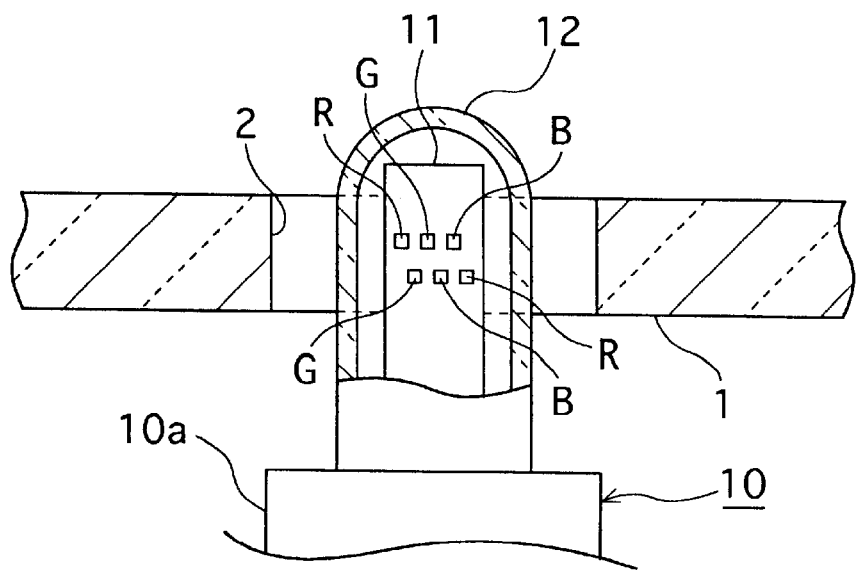
FIG. 4 is a partial sectional view of a first modification of the first embodiment of the LED lamp device seen from the front of the LED substrate.
Figure 5:
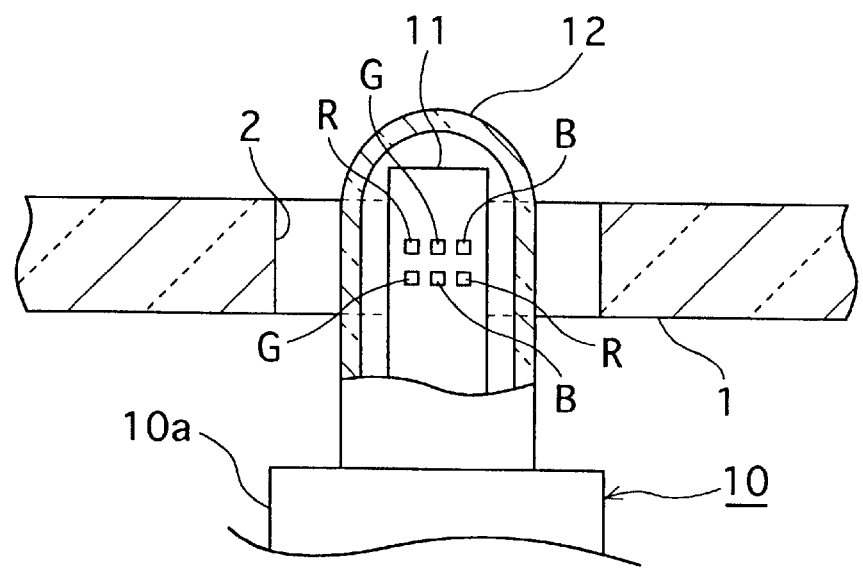
FIG. 5 is a partial sectional view of the second modification of the first embodiment of the LED lamp device seen from the front of the LED substrate.

In case plural sets of chip LEDs R, G, B are arranged in plural rows, it is preferable to arrange the chip LEDs R, G, B in the way shown in FIG. 4, for example. Specifically, in FIG. 4, the chip LEDs R, G, B are placed in a zigzag pattern within the width of the vertical end surface of the substrate 11 in such a manner that the color chip LEDs of a same color are never positioned next to each other vertically or between the upper and lower rows. With this arrangement, different colors of light can be mixed better. Moreover, as shown in FIG. 5, two sets of three primary color chip LEDs R, G, B may be disposed in two rows on each of the front and the rear surfaces of the substrate 11. In this case, it is also desirable to arrange the two sets of chip LEDs R, G, B in such a way that the same color chip LEDs are never positioned next to each other vertically or between the upper and lower rows.

Figure 6:
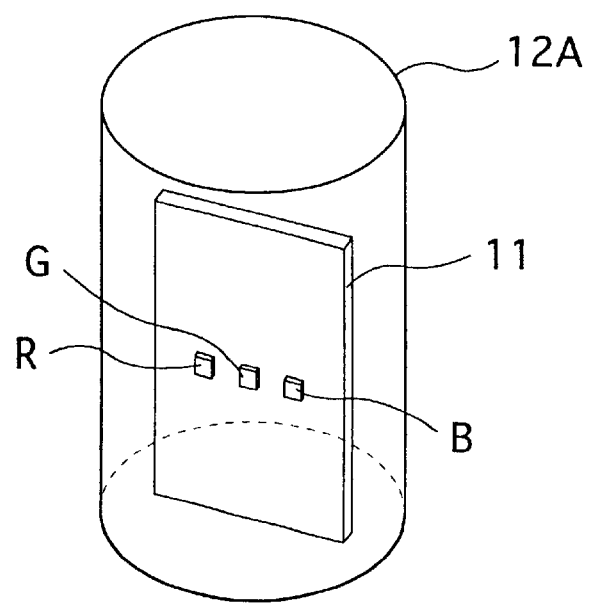
FIG. 6 is a perspective view of the third modification of the first embodiment of the LED lamp device.
Figure 7:
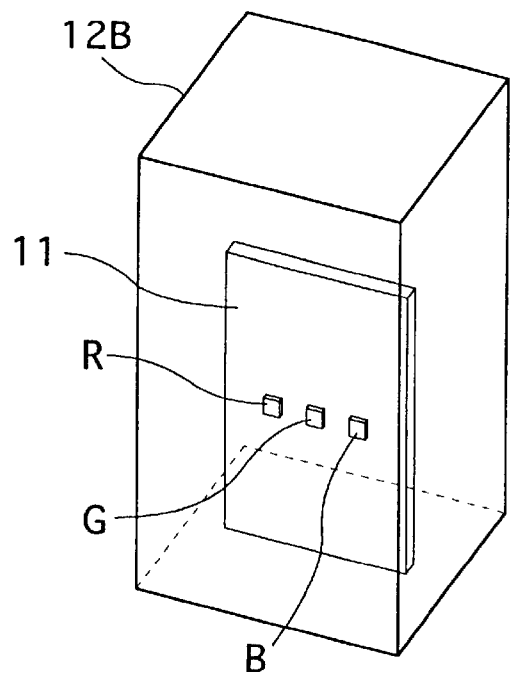
FIG. 7 is a perspective view of the fourth modification of the first embodiment of the LED lamp device.

In the first embodiment of the LED lamp device, the emitted light is introduced directly onto the end surface of the light guide 1. The invention may use a package of a cylindrical column shaped or rectangular parallelepiped column shaped in place of the dome-shaped package 11, 12. For example, as shown in FIG. 6, a hollow cylindrical cap 12A is used as the casing. The substrate 11 and the chip LEDs R, G, B are packaged in the cap 12A, e.g. in an airtight manner. As another example, as shown in FIG. 7, a hollow rectangular parallelepiped cap 12B is used as the casing. The substrate 11 and the chip LEDs R, G, B are packaged in the cap 12B, e.g. in an airtight manner. In both cases, the caps 12A and 12B may be filled with the synthetic resin. Alternatively, the casing may be made of a synthetic resin into the above-mentioned shape and eliminate the cap.

While the substrate 11 and the cap 12 are packaged together to form an omnidirectional lamp in the first embodiment, the invention may give a fixed directivity to the package depending on the position of the through hole 2 from which the light is introduced. For instance, the light guide 1 may have an optical structure or convex lens at a part of the through hole (light incident surface) 2 corresponding to the cap 12 so that the light intensity that enters from a specific position of the through hole 2 can be increased.

[Second Embodiment]

Figure 8:
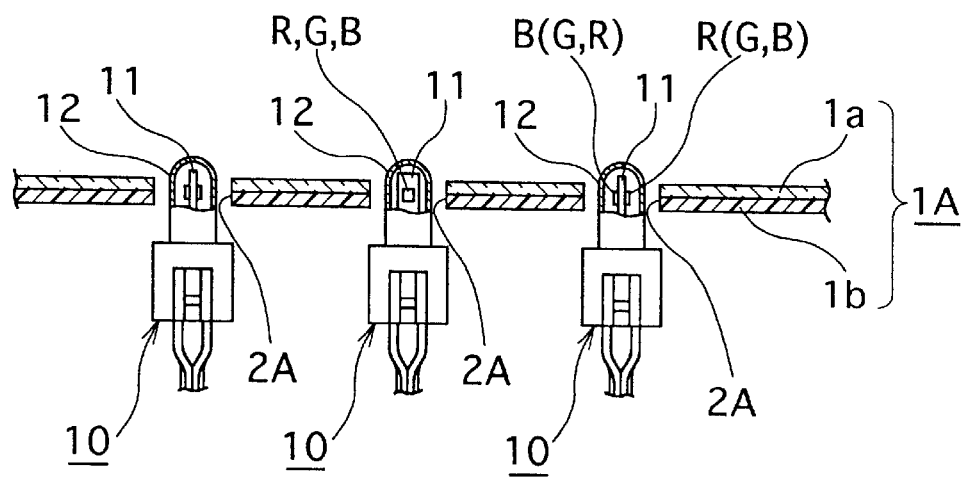
FIG. 8 is an explanatory drawing showing an arrangement of an LED lamp device according to the second embodiment of the invention.

FIG. 8 illustrates an arrangement of an LED lamp device according to a second embodiment of the invention.

In FIG. 8, a light guide 1A has a flat plate shape made by combining a transparent plate 1a and a dispersion plate 1b. In the second embodiment, the light guide 1A has three through holes 2A. Three LED lamps 10 are positioned respectively in the three through holes 2A. A vertically extending end surface of the through hole 2A of the light guide 1A defines a light incident surface from which the light of the chip LEDs comes in. The transparent plate 1a introduces the light of the LED lamp 10 from the end surface of the through hole 2A. The diffusion plate 1*b* reflects the incident light in a planar direction. In the second embodiment, the right and left LED lamps 10 are arranged so that the light emission surfaces on the front and the rear surfaces of the substrate are opposite to each other, facing the right and left directions of FIG. 8. The center LED lamp 10 is disposed so that its light emission surfaces are perpendicular to the light emission surfaces of the right and left LED lamps 10.

In the second embodiment, though not shown in FIG. 8, the LCD 15 is mounted over the light guide 1A just as in the first embodiment shown in FIG. 1. The three LED lamps 10 are placed at such positions that uniform light goes into the LCD 15. Specifically, in the second embodiment, the three LED lamps 10 have the dome-shaped packages 11, 12 and their lenses radiate the light evenly to the entire rear surface of the LCD 15. Thus, the entire surface of the light guide 1A as well as the entire surface of the LCD 15 are uniformly illuminated.

Accordingly, the second embodiment of LED lamp device can uniformly illuminate not only the flat plate light guide 1A but also the plane of the LCD 15 by the use of the characteristic package 11, 12. The first embodiment also has such advantages. However, since the second embodiment has more LED lamps 10 than the first embodiment, the entire surface of the LCD 15 is illuminated more evenly.

[Vehicle Meter]

Next, a vehicle meter that uses the light guide 1, 1A and the LED lamp 10 is described hereafter.

Figure 9:
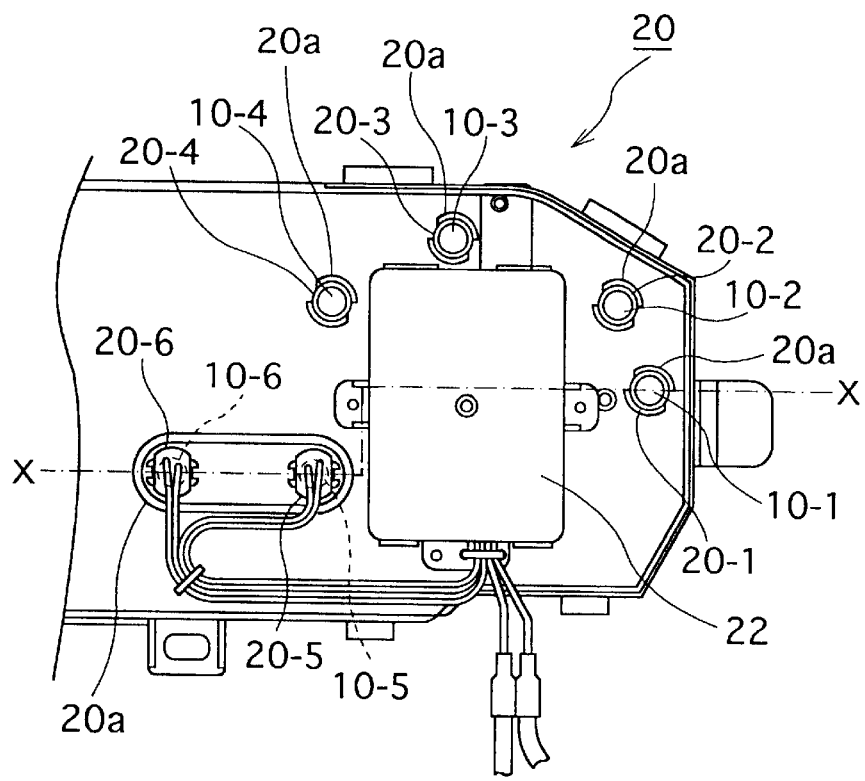
FIG. 9 is a bottom view showing an arrangement of a base board when the first or the second embodiment of the LED lamp device is used for a vehicle meter.
Figure 10:
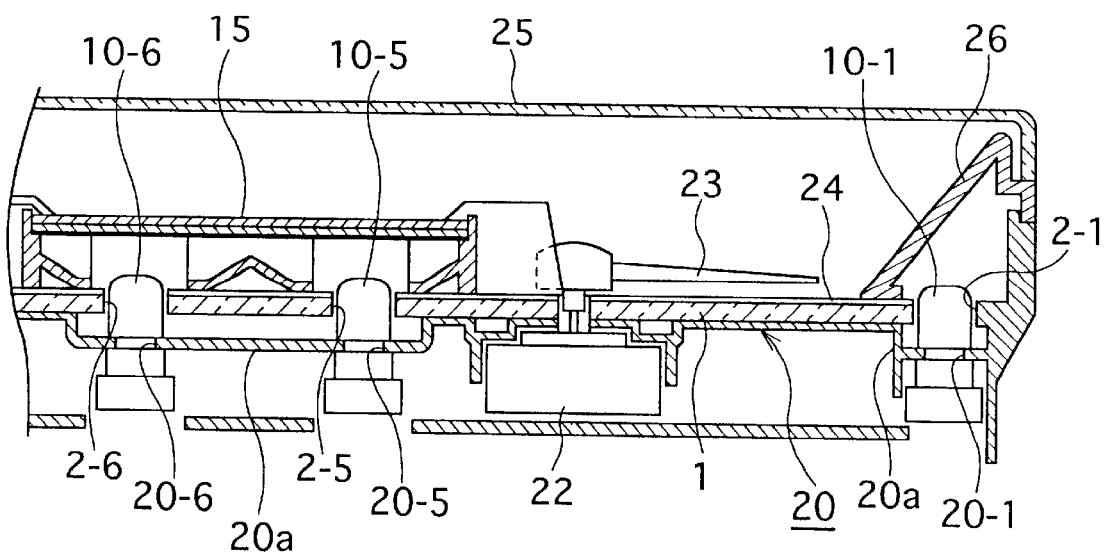
FIG. 10 is a sectional view taken along line X—X of FIG. 9.
Figure 11:
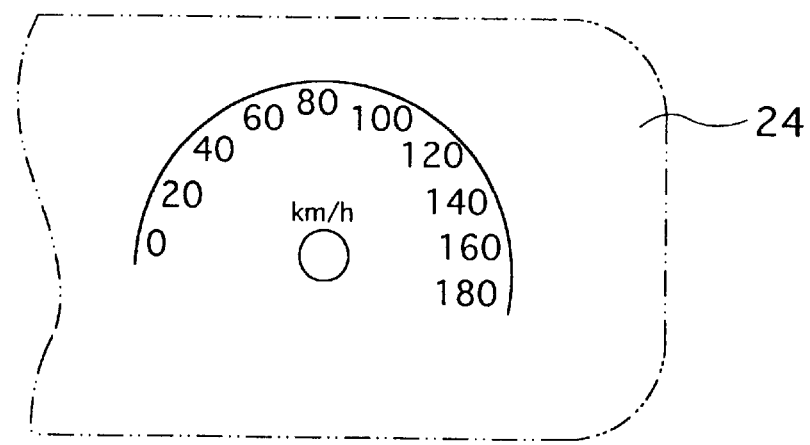
FIG. 11 is a frontal view of a main part of a dial sheet shown in FIG. 10.

FIG. 9 illustrates a base structure for a vehicle meter, based on which the first or the second embodiment of the LED lamp device can be applied. FIG. 10 illustrates a section taken along line X—X of FIG. 9. FIG. 11 illustrates a dial sheet shown in FIG. 10.

In FIGS. 9 and 10, a base structure 20 of essentially flat plate shape functions as a housing of a vehicle meter. The base structure 20 has stepped portions 20*a* at predetermined positions of the vehicle meter. Each stepped portion 20*a* has a dented shape downwardly at a predetermined depth. The LED lamp insertion holes 20-1 to 20-6 are located at fixed positions of the stepped or the dented portions 20*a*. The LED lamp insertion holes 20-1 to 20-6 are provided at six positions in total. Six LED lamps 10-1 to 10-6 are inserted in the LED lamp insertions holes 20-1 to 20-6, respectively. The LED lamps 10-1 to 10-6 are the same as the LED lamp 10 of the first embodiment. The LED lamp insertion holes 20-1 to 20-6 and the LED lamps 10-1 to 10-6 are arranged at predetermined positions depending on the part to be illuminated and illumination mode on the vehicle meter.

A drive unit 22 is fixed on a prescribed position of a rear surface (lower surface in FIG. 10) of the base structure 20. The drive unit 22 has a circuit and a mechanism for driving a pointer 23 built therein. The light guide 1 is disposed on the front surface (upper surface in FIG. 10) of the base structure 20. The light guide 1 has six through holes 2-1 to 2-6 in total. The through holes 2-1 to 2-6 are the same as the through hole 2 of the first embodiment. The centers of the three primary color chip LEDs R, G, B of the LED lamps 10-1 to 10-6 are positioned respectively at the axial centers of the through holes 2-1 to 2-6 that define the centers of the thickness of the vertical end surfaces of the light guide 1, as described earlier in referring to FIGS. 2 and 3. A dial sheet 24 shown in FIG. 11 occupies a predetermined area of the upper surface of the light guide 1. The LCD 15 is disposed over a predetermined location of the light guide 1 to show operational states of specific functions. Some of the LED lamps 10-1 to 10-6 are faced to the LCD 15 as a backlight source.

A transparent cover 25 is placed in front of the vehicle meter. The transparent cover 25 protects the pointer 23 and the dial sheet 24 so that dusts or the like can not come into the interior of the vehicle meter and a user's hands can not touch the pointer 23 and the like. An ornamental cover 26 of some opaque material is also provided to decorate a periphery of the dial sheet 24.

[Operation of Vehicle Meter]

An operation of the above-mentioned vehicle meter is described below.

First, if the three primary color chip LEDs R, G, B of the LED lamps 10-1 to 10-6 are lit, the emitted light goes into the light guide 1 from the through holes 2-1 to 2-6 via the vertical end surfaces (light incident surfaces). The incident light from the through holes 2-1 to 2-6 propagates inside the light guide 1 in essentially radial directions. Then, the light is reflected from the outermost end surface (cut end surface) of the light guide 1. Thereafter, the light reflected from the outermost end surface is further reflected from the through holes 2-1 to 2-6. In this way, the entire plane of the light guide 1 is illuminated substantially uniformly in a white color.

The light emitted from the front surface of the light guide 1 backlights the dial sheet 24 at the dial area. Consequently, the symbols including characters and numerals on the dial sheet 24 are displayed in a color that has been printed or coated on the dial sheet 24. Similarly, the pointer 23 itself is displayed in the color printed in the dial sheet 24, so that the user can clearly know how much the pointer 23 is rotated.

In addition, the light emitted from the front surface of the light guide 1 backlights the LCD 15, thereby displaying indicators of the LCD 15. As a result, the user can be informed of the operational states of the specific functions.

[Modifications]

In the first and second embodiments of the LED lamp devices, three primary color chip LEDs R, G, B are lit at once to mix their colors, thereby illuminating the light guide 1, 1*a* as a whole in the white color. However, the invention may also have a control circuit for controlling a duty ratio or current of each of the R, G, B chip LEDs so as to emit any desired color of light.

The first and the second embodiments of the LED lamp devices are able to introduce the light of the chip LEDs R, G, B efficiently into the light guide 1, 1A. While the first and the second embodiments provide a gap between the package 11, 12 and the peripheral surfaces of the through holes 2, 2A, the invention may also close the gap. Specifically, the package 11, 12 or the cap 12 may have an outer diameter that is essentially the same as the inner diameter of the through hole 2, 2A. Then, the package 11, 12 is disposed in the through hole 2, 2A without any gap. Alternatively, some adhesive may be applied to fill the gap between the outer peripheral surface of the package 11, 12 and the peripheral surface of the through hole 2, 2A. The adhesive is made of the material that has similar refractive index as the package 11, 12. It improves the incident efficiency of the LED light to the light guide 1, 1A if the package 11, 12 and the surface of the through hole 2, 2A are in close contact.

Figure 12:
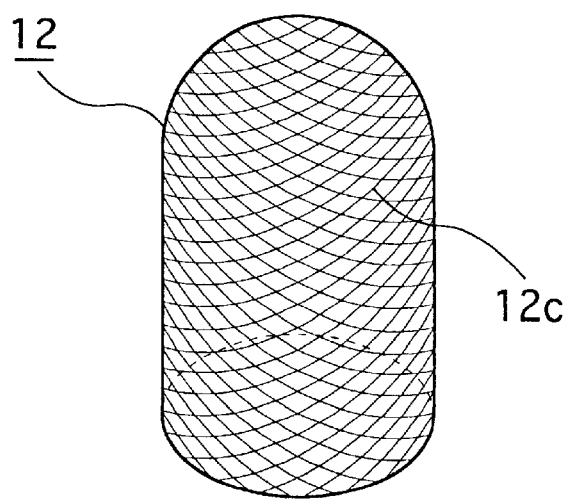
FIG. 12 is s perspective view of a modification of a casing of the inventive LED lamp device.

If there is a gap between the package 11, 12 and the peripheral surface of the through hole 2, 2A of the light guide 1, 1A, a crimp 12*c* may be used to cover an outer surface of the cap 12 constituting the package, as shown in FIG. 12. The crimp 12*c* softens the light radiated from the cap 12 and improves the light distribution. This makes the distribution of the light introduced into the light guide 1 more uniform. If a different object other than the dial 24, e.g.

the LCD 15 or the like, is illuminated, its brightness can be adjusted by the crimp 12c. It introduces a similar effect if a diffusing agent is filled in the cap 12. If the cap 12 is filled with the synthetic resin, such diffusing agent may be mixed in the synthetic resin.

If it is preferable that no light other than the light of the chip LEDs R, G, B can enter the light guide 1, 1A, a metallic film may be used to cover the entire area of the peripheral surface of the through hole 2, 2A except the area facing the chip LEDs R, G, B. In this case, a light shield effect of the through holes 2, 2A is achieved.

While the first or the second embodiment of LED lamp 10 has the three primary colors chip LEDs R, G, B mounted on the opposite surfaces of the substrate 11, the LED lamp 10 may be composed of at least one or more single color chip LEDs in the invention. However, when all three primary color chip LEDs are mounted on both surfaces of the substrate 11, the output light can be adjusted to any desired color from opposite sides in the radial direction of the casing. Furthermore, the invention may have one or more substrates 11 to provide three or more surfaces for mounting the chip LEDs. It improves the characteristics of the light distribution.

Figure 13:
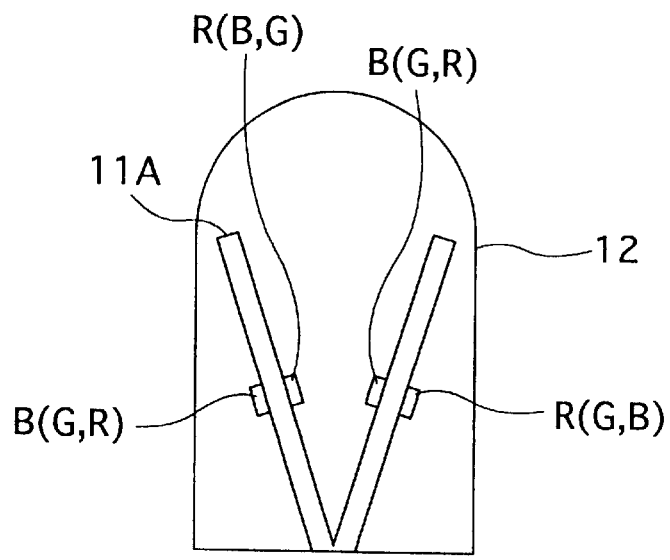
FIG. 13 is a frontal view of the first modification of substrate of the inventive LED lamp device.
Figure 14:
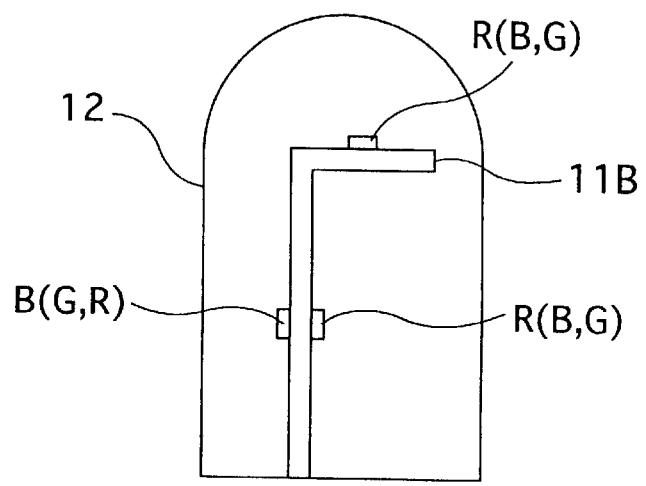
FIG. 14 is a frontal view of the second modification of substrate of the inventive LED lamp device.
Figure 15:
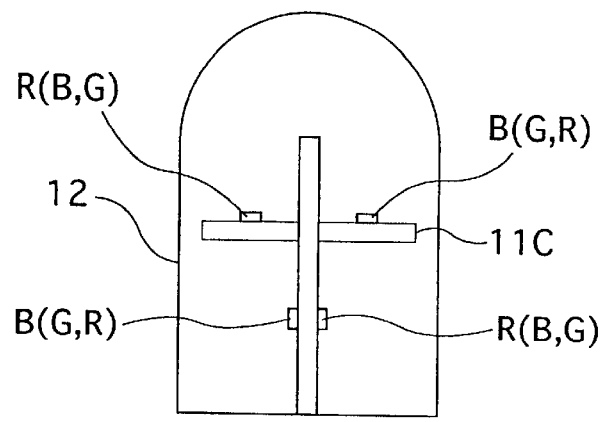
FIG. 15 is a frontal view of the third modification of substrate of the inventive LED lamp device.

For example, FIG. 13 shows the cross section of a V-shaped substrate 11A. The chip LEDs R, G, B are mounted on both surfaces of each of the flat plates. Thus, four light emitting surfaces are provided in total. FIG. 14 shows the cross section of an L-shaped substrate 11B. The chip LEDs R, G, B are mounted on both surfaces of a vertically extending flat plate portion as well as on the upper surface of a horizontally extending flat plate portion. Thus, three light emitting surfaces are provided in total. FIG. 15 shows the cross section of a cross shaped substrate 11C. The chip LEDs R, G, B are mounted on both surfaces of a vertically extending flat plate portion as well as on the upper surfaces of a pair of horizontally extending flat plate portions that are mounted at the right and left sides of the vertical flat plate, respectively. Thus, four light emitting surfaces are provided in total.

Figure 16:
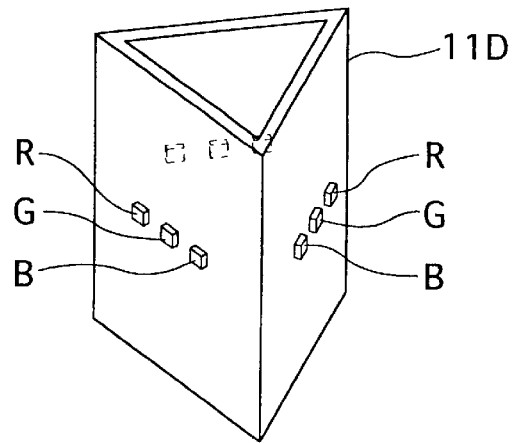
FIG. 16 is a frontal view of the fourth modification of substrate of the inventive LED lamp device.
Figure 17:
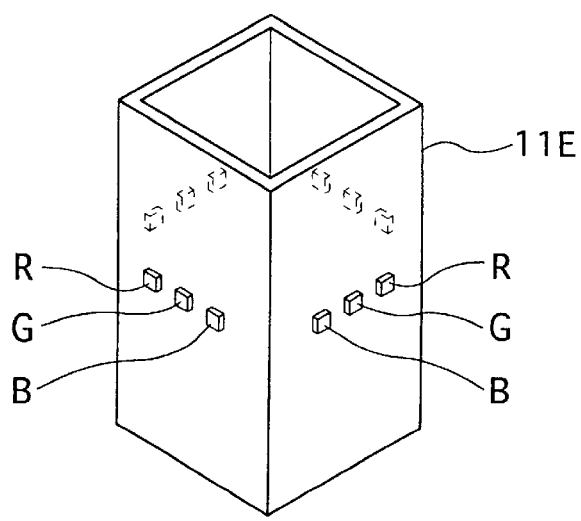
FIG. 17 is a frontal view of the fifth modification of substrate of the inventive LED lamp device.

FIG. 16 shows a substrate 11D of hollow or solid triangular column shape. The chip LEDs R, G, B are mounted on each of the three side surfaces of the substrate 11D. Thus, three light emitting surfaces are provided in total. FIG. 17 shows a substrate 11E of hollow or solid square column shape. The chip LEDs R, G, B are mounted on each of the four side surfaces of the substrate 11E. Thus, four light emitting surfaces are provided in total. Though not shown, hollow or solid cylindrical substrate may also be used to have a desired number of the chip LEDs R, G, B mounted on predetermined locations of the outer peripheral surface of the substrate. In this case, an adjustable number of light emitting surfaces can be provided.

While the first or the second embodiment of the LED lamp device has the three primary color chip LEDs R, G, B mounted on both sides of the substrate 11, the invention may have one or more single color chip LEDs mounted on at least one surface of the substrate 11. Moreover, two colors of the chip LEDs may be mounted on one or more surfaces of the substrate 11. That is, the inventive LED can be an LED that outputs a single color light of a white or other color or a mixed color light of plural colors. In any case, the LED light can be the output directly from one or more surfaces of the substrate 11.

Moreover, if the position of the surface of the substrate is properly adjusted relative to the peripheral surface of the through hole 2, 2A of the light guide 1, 1A, a desirable directivity of the LED light can be set. That is, the light radiated outward from the plural LEDs can be given a desired directivity. Furthermore, the brightness of the LED light can be controlled by changing the number of the chip LEDs mounted on the substrate 11. Therefore, some desired color or colors of light can be sent out from the substrate 11 in desired directions with desired brightness.

While the red chip LED R, the green chip LED G and the blue chip LED B are separately mounted on the substrate 11 in each of the embodiments, one multicolor chip LED can also be used in place of three colors of chip LEDs. That is, the multicolor chip LED has a red LED chip (LED element), a green LED chip and a blue LED chip mounted on one LED substrate. Such multicolor chip LED can emit any desired color of light as the three primary color chip LEDs R, G, B of the above embodiments.

[Third Embodiment]

Figure 18:
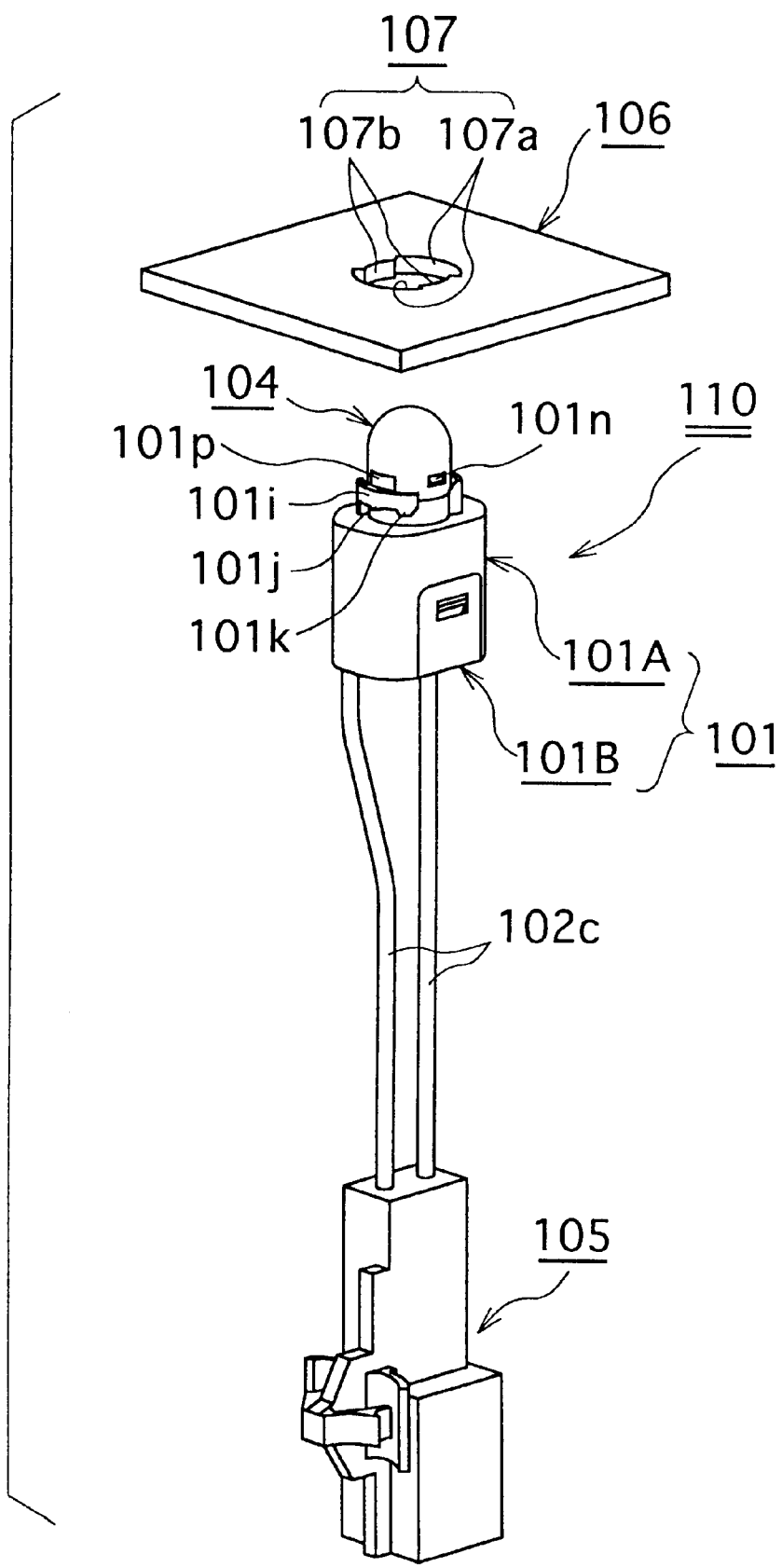
FIG. 18 is a perspective view of an LED lamp device according to the third embodiment of invention before it is assembled to the base structure.
Figure 19:
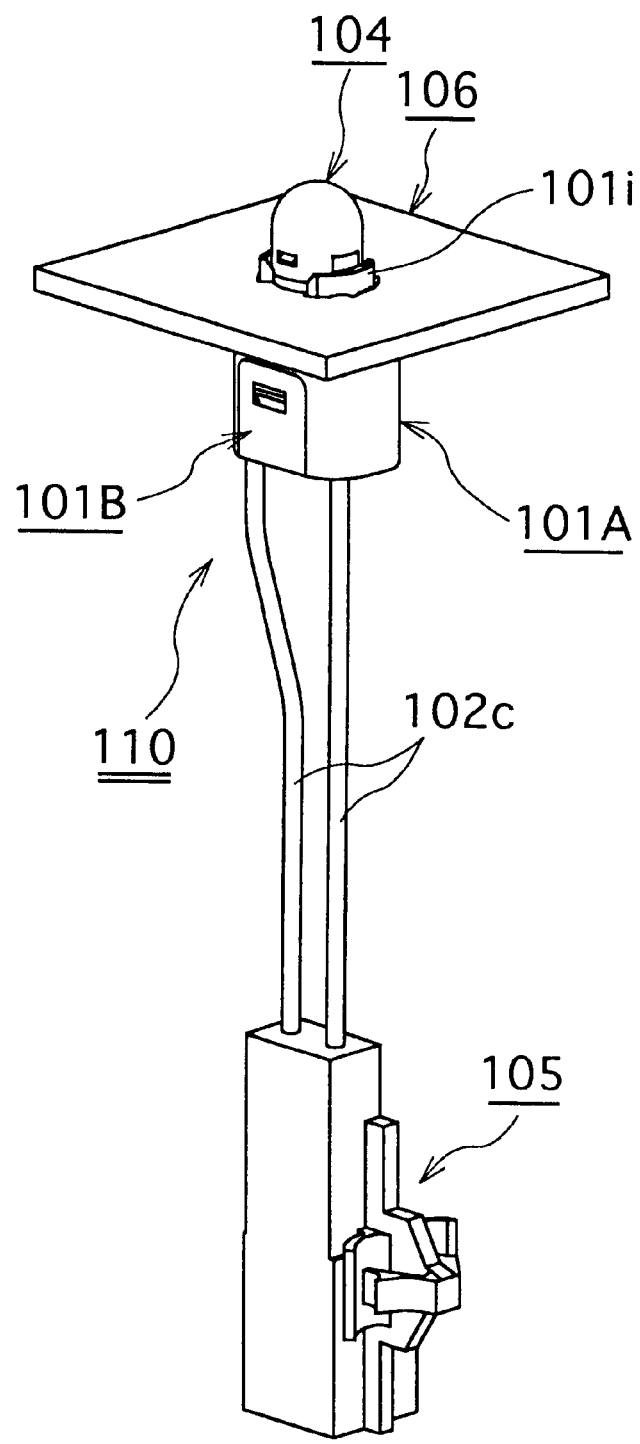
FIG. 19 is a perspective view of the third embodiment of the LED lamp device after it is assembled to the base structure.
Figure 20:
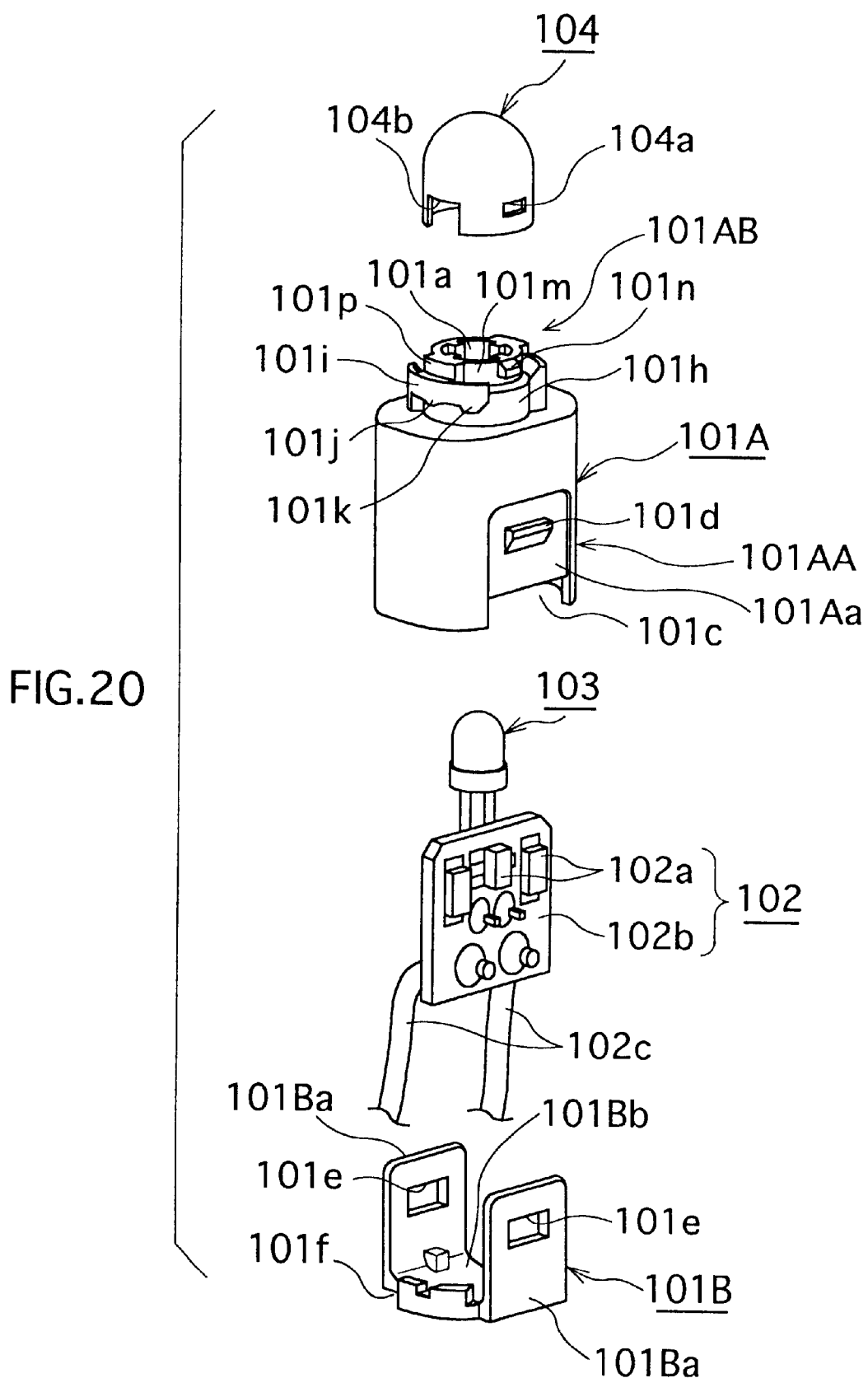
FIG. 20 is a disectional perspective view of the third embodiment of the LED lamp device.
Figure 21:
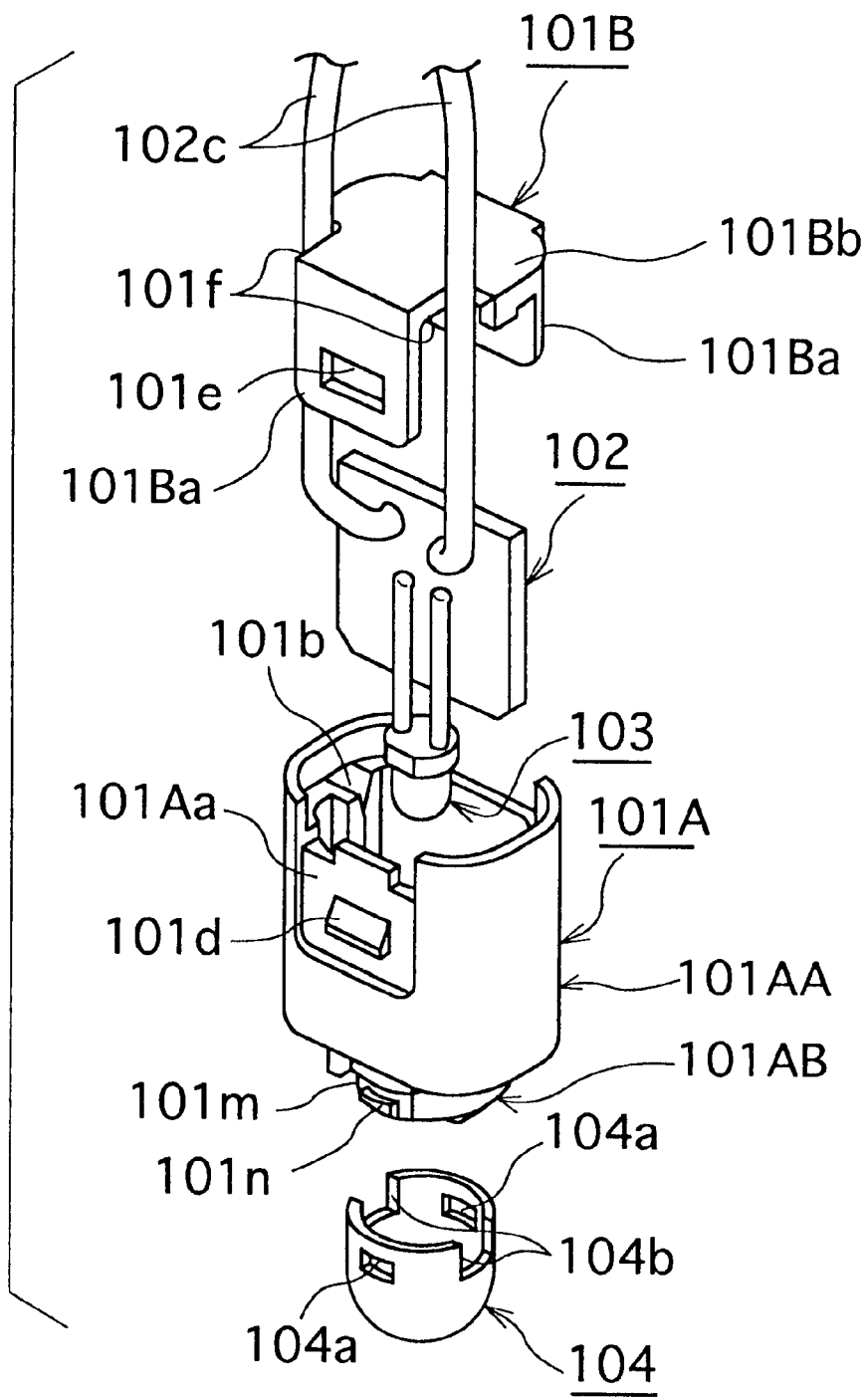
FIG. 21 is a disectional perspective view of the LED lamp device of FIG. 20 displayed upside down.
Figure 22:
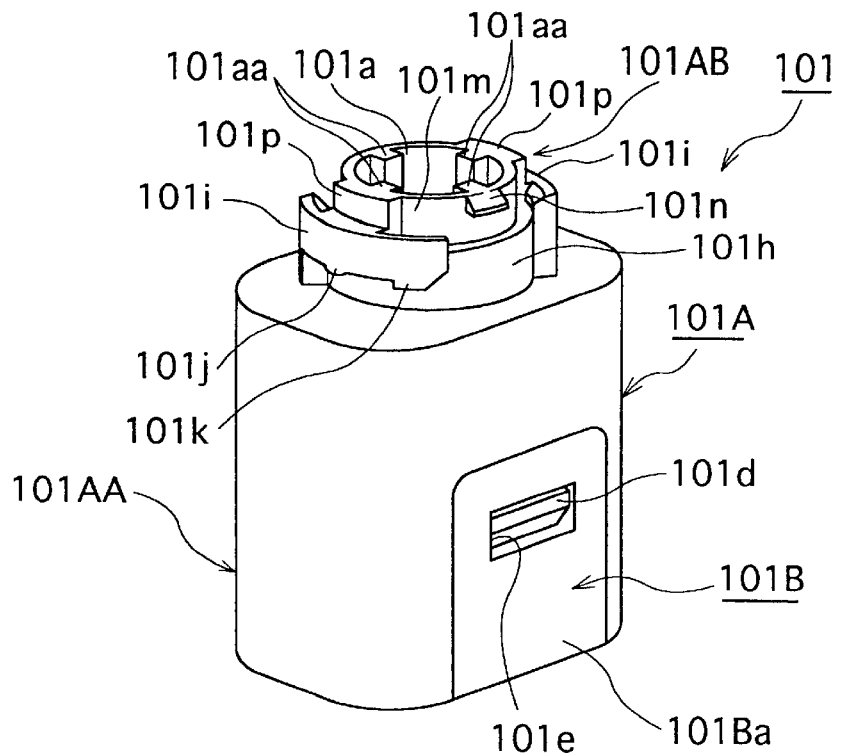
FIG. 22 is a perspective view of a housing of the third embodiment of the LED lamp device.
Figure 23:
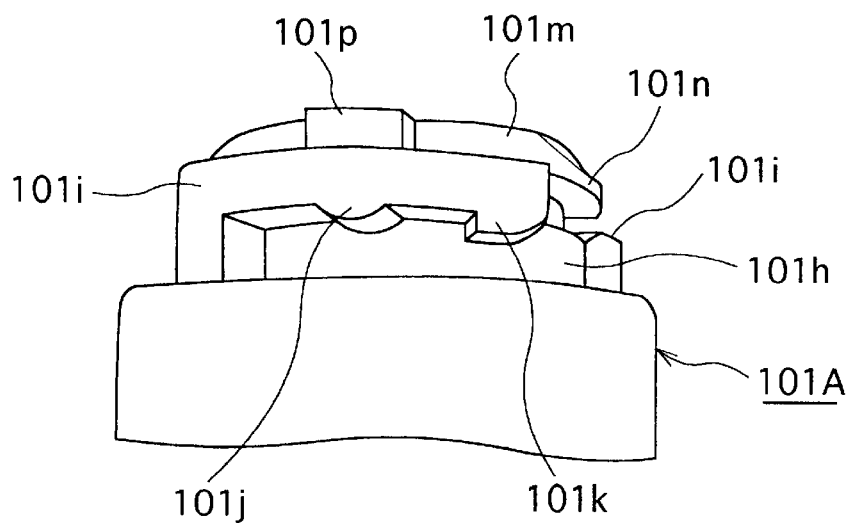
FIG. 23 is an enlarged perspective view of a main part of the housing of the third embodiment of the LED lamp device.

FIG. 18 illustrates an LED lamp device according to a third embodiment of invention before it is assembled to a base structure. FIG. 19 illustrates the third embodiment of the LED lamp device after it is assembled to the base structure. FIG. 20 illustrates the upper side view of the third embodiment of LED lamp device. FIG. 21 illustrates the lower side view of the LED lamp device of FIG. 20. FIG. 22 illustrates a housing of the third embodiment of the LED lamp device. FIG. 23 illustrates a main part of the housing of the third embodiment of the LED lamp device.

In FIGS. 18 and 19, a housing 101 is made of a synthetic resin. The housing 101 is composed of two parts: a main body 101A and an engaging cover 101B that is fitted on the main body 101A. As shown in FIGS. 20 and 21, the main body 101A has a housing portion 101AA and a holding portion 101AB. The housing portion 101AA has a shape of essentially a hollow elliptic cylinder. The holding portion 101AB has essentially a hollow cylindrical shape that protrudes in an axial direction from one end of the housing portion 101AA with a smaller diameter. A pair of engaging dents 101Aa is formed on an outer peripheral surface of the other end of the housing portion 101AA at 180° intervals. Each engaging dent 101Aa has essentially a square shape. The engaging cover 101B is composed of a pair of engaging side portions 101Ba and a shielding bottom portion 101Bb, thereby forming a channel cross-section. The side portion 101Ba has essentially a square plate shape corresponding to the engaging dent 101Aa. The bottom portion 101Bb connects the lower ends of the side portions 101Ba.

The holding portion 101AB has a supporting portion 101a and a pair of guide grooves 101b. As shown in FIG. 22, four protrusions 101aa are formed integrally on an inner peripheral surface of the supporting portion 101a about 90° apart, radially. The protrusion 101aa extends in an axial direction of the supporting portion 101a. An LED lamp 103 is inserted into the supporting portion 101a from one end (lower end in FIG. 20) thereof. Then, the protrusions 101aa hold an outer peripheral surface of the LED lamp 103 and keep their holding state. On the other hand, the guide grooves 101b are arranged on the inner peripheral surface of the holding portion 101AB at 180° intervals or at both ends of a major axis of the elliptical holding portion 101AB. A power converting circuit 102 is inserted and fitted into the guide grooves 101b.

In FIG. 20, the power converting circuit 102 is made of a printed circuit board 102b on which electronic parts 102a are mounted. The printed circuit board 102b converts the voltage and current inputted from a power source into the voltage and current needed for driving the LED lamp 103.

The guide grooves 101b holds both lateral ends of the printed circuit board 102b and maintains its holding state to prevent it from being detached or loosened.

The housing portion 101AA has an opening at another end 101c. An engaging protrusion 101d is disposed around the center of each of the engaging dents 101Aa. Each of the side portion 101Ba has an engaging hole 101e that is engaged with the engaging protrusion 101d at a corresponding position thereto. The side portions 101Ba are fitted on the engaging dents 101Aa, while leads 102c are taken out from cutouts 101f of the engaging cover 101B. Then, the engaging protrusions 101d and the engaging holes 101e can engage with each other. Thus, the engaging cover 101B is fitted on the main body 101A so that they make one body or the housing 101. In this state, the bottom portion 101Bb supports the lower end of the printed circuit board 102b, while the supporting portion 101a holds the outer periphery of the LED lamp 103. Moreover, the guide grooves 101b supports the opposite lateral ends of the printed circuit board 102b. Therefore, the power converting circuit 102 is accommodated in the housing 101 and is not easily detached nor loosened.

In FIG. 22, the holding portion 101AB has a stepped cylindrical shape where a large diameter portion and a small diameter portion are arranged successively from the axial base end. Specifically, a protruded portion (larger diameter portion) 101h is formed on the axial base end of the outer peripheral surface of the holding portion 101AB. The protruded portion 101h has a cylindrical shape with a predetermined outer diameter. Moreover, as shown in FIG. 23, a pair of locking ribs 101i serving as an engaging mechanism is formed on the outer peripheral surface of the protruded portion 101h at positions about 180° apart. Each locking rib 101i rises from the main body 101A and extends along a circumference of the protruded portion 101h in a reversed L-shape. Thus, the locking rib 101i has a bracket-shape. The locking rib 101i has an elastic protrusion 101j and a locking protrusion 101k. The elastic protrusion 101j is elastically in touch with a peripheral surface of an attachment hole 107, as shown in FIG. 18, that is bored on a flat portion of a plate-shaped base structure 106. The locking protrusion 101k is engaged with the attachment hole 107.

An inserted portion 101m is formed at the top end (upper end) of the protruded portion 101h of the holding portion 101AB. The inserted portion 101m has a cylindrical shape of a smaller diameter than the protruded portion 101h. A pair of cap engaging protrusions 101n is formed on an outer peripheral surface of the inserted portion 101m at positions about 180° apart. Cap supporting protrusions 101p is formed on the outer peripheral surface of the inserted portion 101m at the middle of the cap engaging protrusions 101n.

While protecting the LED lamp 103, a cap 104 in FIG. 20 also diffuses the light of the LED lamp 103 to a larger area. The cap 104 has a dome shape. A pair of cutouts 104b is formed on an opening end of the cap 104 roughly 180° apart. The cap supporting protrusions 101p are fitted in the cutouts 104b, respectively. A pair of cap engaging holes 104a is formed on the opening end of the cap 104 about 180° apart. The cap engaging protrusions 101n are fitted in the cap engaging holes 104a, respectively.

The LED lamp 103 is mounted on the printed circuit board 102b. The power converting circuit 102 is an electronic circuit that supplies a voltage and a current for lighting the LED lamp 103 when an input voltage for lighting a lamp bulb is provided. The power converting circuit 102 may be a circuit outputting the power obtained by some constant voltage control or constant current control. Alternatively, the power converting circuit 102 may be a circuit outputting the power obtained by PWM control. Normally, the power converting circuit 102 is composed of a resistor circuit or an inverter circuit.

The LED lamp 103 may be an LED outputting the light of a white color or other single colors or a color mixing a plurality of colors. While the LED lamp 103 is used as the LED in the third embodiment, a plurality of chip LEDs may be used as the LED. For example, the chip LEDs R, G, B mounted on the substrate 11 may be housed in the cap 104 as described in the first embodiment. Specifically, the substrate 11 is fixed on the printed circuit board 102b so that it protrudes from the upper end of the housing 101 and housed in the cap 104 at right angles to the plane of the upper end of the housing 101 or the lower end of the cap 104. The substrate 11 is electrically connected with the printed circuit board 102b. The chip LEDs R, G, B are mounted on the substrate 11 in the same manner as the first embodiment or its modifications. Then, the substrate 11 and the chip LEDs R, G, B are inserted and housed in the cap 104. In this case, the cap 104 functions in the same way as the cap 12 or the casing in the first embodiment.

The housing 101 may be any type of synthetic resin container that accommodates and fixes one or more LED lamps 103 at the end portion. It also houses the power converting circuit 102 therein and has an external mechanism mountable on the attachment hole 107 of the base structure 106. If the combination of the substrate 11 and the chip LEDs R, G, B is used in place of the LED lamp 103, the housing 101 has a shape that can contain therein the substrate 11 and the chip LEDs R, G, B from the lower end. Moreover, the supporting portion 101a is modified to support and fix the lower end of the substrate 11.

The LED lamp device 110 is assembled as follows.

First, the printed circuit board 102b with the LED lamp 103 (or the substrate 11 and the chip LEDs R, G, B) and the electronic parts 102a mounted thereon is inserted in the guide grooves 101b from the opening of the other end 101c of the main body 101A. Next, the LED lamp 103 (or the substrate 11 and the chip LEDs R, G, B) is inserted and fixed in the supporting portion 101a.

Then, the engaging cover 101B is fitted in the other end 101c of the main body 101A, while the leads 102c connected to the printed circuit board 102b are taken out from the opening of the other end 101c of the main body 101A. Thereafter, the engaging protrusions 101d of the main body 101A and the engaging holes 101e of the engaging cover 101B are engaged with each other so as to make one body.

Then, the engaging protrusions 101n and the supporting protrusions 101p are fitted in the engaging holes 104a and cutouts 104b, respectively. Thereby, the engaging protrusions 101d are engaged with the engaging holes 104a, thereby unifying the main body 101A and the cap 104.

Thereafter, a connector 105 in FIG. 18 is electrically and mechanically connected to the other ends of the leads 102c that are away from the printed circuit board 102b.

Thus, the third embodiment of LED lamp device 110 is assembled. The assembled LED lamp device 110 is attached to the base structure 106 as follows. The base structure 106 is applicable to the housing of the vehicle meter or the like as in the base structure 20 of the first embodiment.

Referring to FIG. 18, the base structure 106 is made of a synthetic resin with a predetermined thickness of plate shape. The base structure 106 has the attachment holes 107. The attachment hole 107b has a pair of large diameter portions 107a and a pair of small diameter portions 107b. The large diameter portions 107a are positioned about 180° apart along the circumference of the attachment hole 107. Each of the large diameter portions 107a has an arc length a little longer than a quarter of the circumference of the attachment hole 107. The small diameter portions 107b are positioned about 180° apart. Each of the small diameter portions 107b has an arc length a little shorter than a quarter of the circumference of the attachment hole 107. The large diameter portions 107a and the small diameter portions 107b are disposed 90° apart. The small diameter portions 107b protrude inward from the large diameter portions 107a.

The pair of locking ribs 101i of the main body 101A is inserted in the pair of large diameter portions 107a of the attachment hole 107. After the insertion is completed, the main body 101A is rotated so that the locking protrusions 101k ride on the small diameter portions 107b of the attachment hole 107 against the elastic portion of the locking ribs 101i. For example, in the case of FIG. 18, the main body 101A is rotated counterclockwise in relation to the base structure 106. After the rotation, the elastic protrusions 101j of the locking ribs 101i ride on the small diameter portions 107b, respectively. Then, the locking protrusions 101k that are on the small diameter portions 107b come down from the end of the small diameter portions 107b because of the elasticity, thereby touching the end of the small diameter portions 107b. At the same time, the other ends of the small diameter portions 107b are in contact with the L-shaped rising portions of the locking ribs 101i.

Consequently, each of the small diameter portions 107b is held between the rising portion of the locking rib 101i and the locking protrusion 101k. Moreover, the elastic protrusion 101j supports the small diameter portion 107b so as to prevent the loosening between the locking rib 101i and the small diameter portion 107b.

In the third embodiment, the rising portion of the locking rib 101i functions as another locking rib for supporting the small diameter portion 107b. Moreover, the rising portion of the locking rib 101i unifies the elastic protrusion 101j and the locking protrusion 101k firmly to the main body 101A. However, the invention may provide the locking protrusions 101k at both ends of the locking rib 101i.

Figure 24:
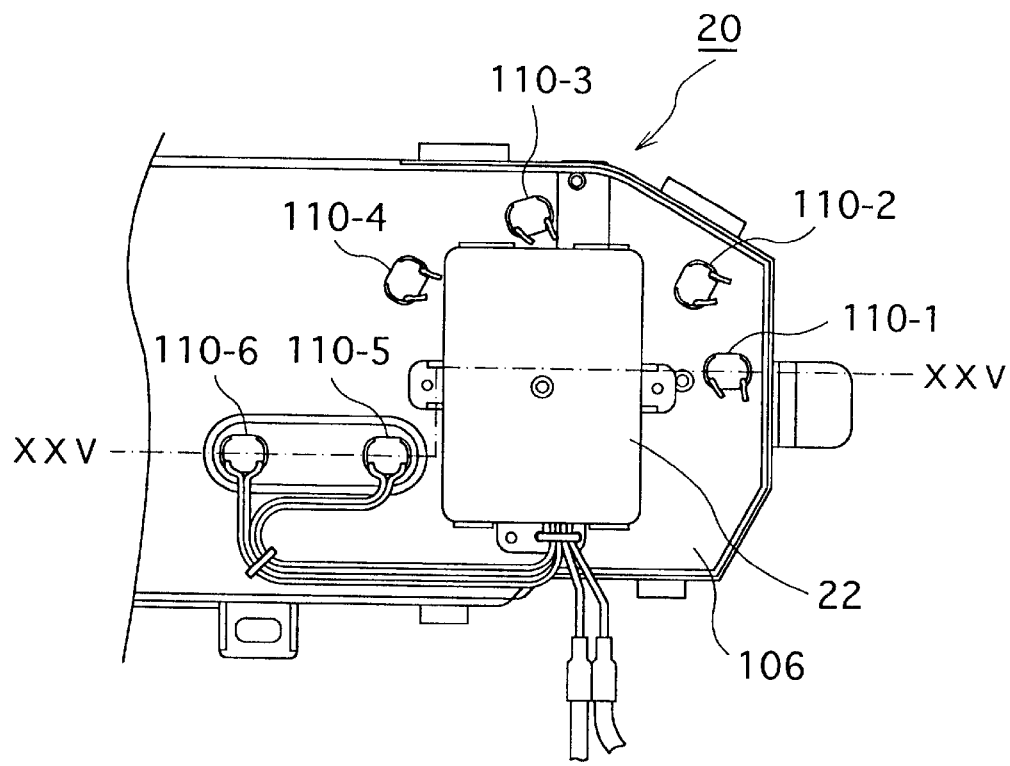
FIG. 24 is a bottom view of a vehicle meter on which the third embodiment of the LED lamp device is assembled.
Figure 25:
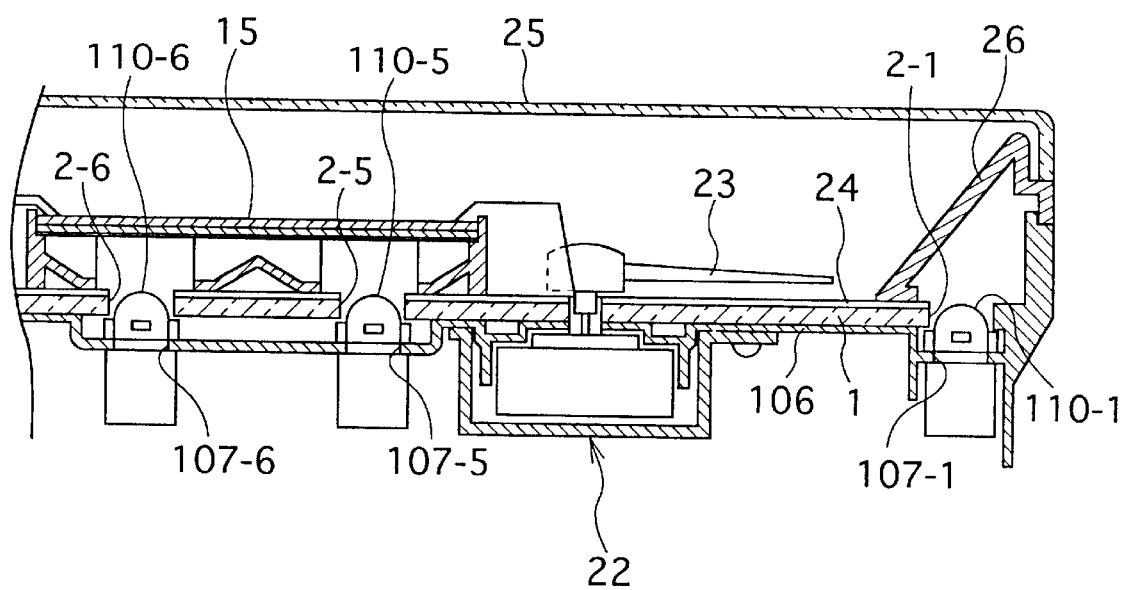
FIG. 25 is a sectional view taken along line XXV—XXV of FIG. 24.

FIG. 24 illustrates a vehicle meter to which the third embodiment of LED lamp device is assembled. FIG. 25 illustrates a section taken along line XXV—XXV of FIG. 24.

Referring to FIGS. 24 and 25, the housing 20 of the vehicle meter is composed of the base structure 106. The base structure 106 has six attachment holes 107-1 to 107-6 in total, though 107-2 to 107-4 are not shown in the figure. The attachment holes 107-1 to 107-6 are the same as the attachment hole 107. LED lamp devices 110-1 to 110-6 are fitted in the attachment holes 107-1 to 107-6, respectively. The LED lamp devices 110-1 to 110-6 are the same as the LED lamp device 110. The light guide 1 is disposed on the front surface of the base structure 106. The axial center positions of the LED lamps 103 in the LED lamp devices 110-1 to 110-6 are located respectively at the axial center positions of the through holes 1-1 to 1-6 of the light guide 1.

On the vehicle meter constructed as indicated above, when the LED lamps 103 of the LED lamp devices 110-1 to 110-6 are lit, the emitted light enters the light guide 1. Then, the entire surface of the light guide 1 is illuminated almost uniformly with a prescribed color as in the first embodiment. Accordingly, the characters of the dial and the like are displayed with the color printed on the dial sheet 24. The pointer 23 is also displayed with the color printed on the dial sheet 24. The LCD 15 is uniformly illuminated as in the first embodiment.

In the third embodiment of the LED lamp device 110, the housing 101 has a structure compatible with a bulb package socket. Moreover, the LED lamp device 110 accepts the same electric condition as the bulb because of the power converting circuit 103. Therefore, in the LED lamp device 110, one or more LED lamps 103 can be replaced with one or more bulb lamps if desired. Another advantage of the LED lamp 103 is that it can emit a desired color of light. Due to compatibility between a bulb and the LED lamp device 110, they can substitute each other.

The main body 101A can accommodate the printed circuit board 102b by the guide grooves 101b, while keeping such accommodating state.

The housing 101 in the third embodiment can set the desired directivity of the LED lamp 103. Particularly, if the cap 104 is made of a material that diffuses the light, the cap 104 can have a semi-spherical directivity. If the housing 101 has a crimp on the outer surface or contains a dispersing agent, the light distribution becomes more uniform. If lens is formed on part of the cap 104, a spot illumination can be obtained. In the third embodiment, the cap 104 is not always necessary. However, if the cap 104 is provided, the light diffusion becomes more efficient as described above.

In the third embodiment, the LED lamp device 110 can be mounted firmly on the base structure 106 (e.g. the housing of the vehicle meter) by the small diameter portions 107b and the locking ribs 107i.

While a single LED lamp 103 is accommodated in the housing 101 in FIGS. 18 to 23, the invention may dispose one or more chip LEDs on the substrate so that an optical axis of the chip LED is in the same direction as the axis of the housing 101. Alternatively, the optical axis may also be perpendicular to the axis of the housing 101. Moreover, plural chip LEDs may be arranged successively in the same direction as the axial direction of the housing 101 or placed successively in the direction perpendicular to the axial direction of the housing 101.

It is possible to combine the first or the second embodiment of LED lamp device, particularly the package 11, 12, with the third embodiment of the main body 101A and the engaging cover 101B. For example, the LED lamp 103 is replaced with the casing 12 incorporating therein the substrate 11 and chip LEDs R, G, B. In this case, the cap 104 can be omitted. Then, as mentioned in the first embodiment, the plural chip LEDs R, G, B are mounted on the substrate 11 at positions facing the light incident surface (peripheral surfaces of the through holes 2) and are arranged within the thickness of the light incident surface of the light guide 1. In this case, the base 10a of the first embodiment corresponds to the main body 101A, the engaging cover 101B and the parts accommodated therein of the third embodiment. It is also possible that the chip LEDs R, G, B mounted on the substrate 11 are fitted on the upper end of the housing 101 and housed in the cap 104 as mentioned above. In this case, the cap 12 of the first embodiment is unnecessary.

A locking mechanism like the locking ribs 101i (see FIG. 23) may be provided on the upper end of the base 10a or the lower end of the casing 12 in the structure of FIGS. 9 and 10. Moreover, the LED lamp insertion holes 20-1 to 20-6 of the base structure 20 are provided with the same structure as the attachment holes 107-1 to 107-6 of the base structure 106. Specifically, the LED lamp insertion holes 20-1 to 20-6 are formed with the large diameter portions 107*a* and the small diameter portions 107*b*. Then, the locking mechanism of the LED lamp device is engaged and fixed in the LED lamp insertion holes 20-1 to 20-6 of the base structure 20.

The elastic protrusion 101*j* may be modified in other ways as long as it is such structured that it keeps elastic contact with the peripheral surface of the attachment hole 107. The locking protrusion 101*k* may also be modified based on needs as long as it can lock relative rotation of the housing 101 and the base structure 107 in the circumferential direction of the attachment hole 107.

The preferred embodiments described herein are illustrative and not restrictive, the scope of the invention being indicated in the appended claims and all variations which come within the meaning of the claims are intended to be embraced therein.

What is claimed is:

1. A light emitting diode (LED) lamp device comprising:

chip LEDs each of which has a light emission surface;

a substrate having a flat plate shape portion that has a pair of opposite surfaces on each of which at least one of said chip LEDs is mounted so that the light emission surface of each of the chip LEDs is placed on a plane parallel to the opposite surfaces of the flat plate shape portion of the substrate; and a casing made of a transparent synthetic resin, the casing accommodating the chip LEDs and the substrate therein.

2. A light emitting diode (LED) lamp device comprising:

a light guide of essentially a plate shape;

a chip LED disposed on a plane perpendicular to the plane of the light guide, the chip LED emitting light directly to an end surface of the light guide;

a substrate having one or more surface on which the chip LED is mounted; and a casing made of a transparent synthetic resin, the casing accommodating the chip LED and the substrate therein.

3. The LED lamp device according to claim 2, in which:

the light guide has a light incident surface extending in a direction perpendicular to the plane of the light guide;

the substrate is disposed essentially parallel to the light incident surface of the light guide; and the chip LED is mounted on the substrate so as to face the light incident surface of the light guide so that the light of the chip LED goes directly onto the light incident surface.

4. The LED lamp device according to claim 2, in which the casing has a crimp on an outer surface thereof.

5. The LED lamp device according to claim 2, in which a plurality of the LED elements are mounted as the chip LED on the surface of the substrate in such a manner that the LED elements are arranged linearly in a row.

6. The LED lamp device according to claim 3, in which the chip LED is mounted on the substrate at such a position as to face the light incident surface of the light guide, the chip LED being located within the thickness of the light guide.

7. The LED lamp device according to claim 3, in which the chip LED comprises three primary colors of LED elements, the three primary colors of LED elements being located within the thickness of the light guide so as to be successively arranged in a circumferential direction of the light incident surface.

8. The LED lamp device according to claim 3, in which a plurality of sets of LED elements are provided as the chip LED on the substrate, each set of the LED elements comprising three primary colors of LED elements, each set of the three primary colors of LED elements being located within a thickness of the light guide so as to be successively arranged in a circumferential direction of the light incident surface, the plural sets of three primary colors of LED elements being arranged in plural lines.

9. The LED lamp device according to claim 3, in which two sets of LED elements are provided as the chip LED on the substrate, each set of the LED elements comprising three primary colors of LED elements, the two sets of three primary colors of LED elements being mounted on the opposite surfaces of the substrate, respectively.

10. The LED lamp device according to claim 3, in which the casing has a column shape.

11. The LED lamp device according to claim 3, in which a plurality of the casings with the substrate and the chip LED accommodated therein are disposed on the light guide, adjacent ones of the casings being arranged so that the substrates therein are perpendicular to each other.

12. A vehicle meter comprising a dial and a light source for the dial, the dial being composed of the light guide of the LED lamp device of claim 3 and the light source being composed of the chip LED of the LED lamp device of claim 3.

13. The LED lamp device according to claim 3, in which the substrate has a cross-section of one of V-shape, L-shape and cross-shape, the chip LED being mounted on three or more surfaces of the substrate.

14. The LED lamp device according to claim 3, in which the substrate has a solid or hollow column shape, the chip LED being mounted on each surface of the substrate.

15. A light emitting diode (LED) lamp device comprising:

a chip LED;

a substrate having one or more surfaces on which the chip LED is mounted;

a casing made of a transparent synthetic resin, the casing accommodating the chip LED and the substrate therein; and a synthetic resin housing having an end portion on which the casing is fixed, the housing accommodating the substrate therein, the housing having a locking structure on an outer peripheral surface, the locking structure being mountable on an attachment hole of a base structure.

16. The LED lamp device according to claim 15, further comprising a cap covering the chip LED.

17. The LED lamp device according to claim 15, in which the housing has a structure compatible with a package socket for a lamp bulb.

18. The LED lamp device according to claim 15, in which:

the attachment hole has essentially a circular shape, the base structure having an inwardly protruding small diameter portion formed on part of the attachment hole; and the locking mechanism has a locking rib of a bracket shape, the locking rib has an elastic protrusion and a locking protrusion, the elastic protrusion elastically in contact with an edge surface of the base structure around the attachment hole, the locking protrusion being engaged with the small diameter portion of the base structure so as to prevent rotation of the housing relative to the attachment hole of the base structure.

19. A light emitting diode (LED) lamp device comprising:

an LED lamp;

a power converting circuit converting an input power source voltage and an input power current into a voltage and a current for driving the LED lamp; and a synthetic resin housing accommodating therein the LED lamp and the power converting circuit, the housing fixing the LED lamp at one end thereof, the housing having a locking structure on an outer peripheral surface, the locking structure being mountable on an attachment hole of a base structure.

\* \* \* \* \*